(12) United States Patent
Robinson

(10) Patent No.: US 6,894,632 B1
(45) Date of Patent: May 17, 2005

(54) PROGRAMMABLE ANALOG-TO-DIGITAL CONVERTER

(75) Inventor: Ian Robinson, Venice, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/758,206

(22) Filed: Jan. 14, 2004

(51) Int. Cl.[7] .................................. H03M 3/00
(52) U.S. Cl. ........................ 341/143; 341/155
(58) Field of Search ................... 341/143, 155

(56) References Cited

U.S. PATENT DOCUMENTS

| | | | | |
|---|---|---|---|---|
| 5,952,947 A | * | 9/1999 | Nussbaum et al. | 341/143 |
| 6,028,544 A | * | 2/2000 | Zarubinsky et al. | 341/143 |
| 6,351,145 B1 | * | 2/2002 | Lesea | 326/41 |
| 6,356,603 B1 | * | 3/2002 | Martin et al. | 375/345 |
| 6,362,762 B1 | * | 3/2002 | Jensen et al. | 341/143 |
| 6,437,718 B1 | * | 8/2002 | Oyama et al. | 341/143 |
| 6,577,258 B2 | * | 6/2003 | Ruha et al. | 341/143 |
| 6,587,060 B1 | * | 7/2003 | Abbey | 341/143 |
| 6,628,216 B2 | * | 9/2003 | Chen et al. | 341/120 |
| 6,639,526 B1 | * | 10/2003 | Mayes | 341/61 |
| 6,686,860 B2 | * | 2/2004 | Gulati et al. | 341/155 |
| 6,693,573 B1 | * | 2/2004 | Linder | 341/143 |

* cited by examiner

*Primary Examiner*—Jean Bruner Jeanglaude
(74) *Attorney, Agent, or Firm*—Tarolli, Sundheim, Covell & Tummino L.L.P.

(57) ABSTRACT

Systems and methods are disclosed that employ a programmable analog-to-programmable digital converted system. A programmable analog-to-digital converter system comprises a quantizer assembly and configuration control. The quantizer assembly is configurable to provide at least one quantization stage. A given quantization stage converts an associated analog signal into an associated digital output signal. The configuration control selects among a plurality of configurations and configures the analog-to-digital converter system according to the selected configuration. The quantizer assembly is configurable to provide a plurality of quantization stages arranged in series in a first configuration, or to provide a single quantization stage in a second configuration.

28 Claims, 6 Drawing Sheets

PROGRAMMABLE ANALOG-TO-DIGITAL CONVERTER

TECHNICAL FIELD

The present invention relates generally to communications systems, and more specifically to analog-to-digital converters.

BACKGROUND OF THE INVENTION

Efforts in the design of integrated circuits for radio frequency (RF) communication systems generally focus on improving performance, reducing cost or a combination thereof. One area of increasing interest relates to conversion of signals, such as from analog-to-digital or digital-to-analog. Both types of conversion have benefited from the development and use of delta-sigma modulation.

Delta-sigma modulation is a technique used to generate a very high fidelity (e.g., low noise) estimate of a signal using a small number of quantization levels and a very high sampling rate. Limiting a signal to a finite number of levels introduces significant "quantization" noise into the system. Oversampling and the use of an integrator feedback-loop in delta-sigma modulation are effective in shifting noise, primarily quantization noise, to out-of-band frequencies. The noise shifting properties enable efficient use of subsequent filtering stages to remove noise and produce a more precise representation of the input.

There is generally a compromise between bandwidth and dynamic range in analog-to-digital converter (ADC) technology. ADCs with the widest dynamic range generally compromise on the smallest signal they can successfully convert in the presence of quantization noise or spurious signals due to non-linearities. There is also generally a tradeoff between the bandwidth, or conversion speed, of an ADC and the amount of circuitry required. For many applications, the maximum performance of a component is needed for only a small fraction of the operations space. Much of the time, another performance aspect would be better emphasized. In other applications the requirement for small quantification noise only applies to a subset of the input signals; whereas a larger noise level can be tolerated for the remaining input signals.

SUMMARY OF THE INVENTION

In accordance with one aspect of the invention, a programmable analog-to-digital converter (ADC) system includes a quantizer assembly and a configuration control. The quantizer assembly is configurable to provide at least one quantization stage. A given quantization stage converts an associated analog signal into an associated digital output signal. The configuration control selects among a plurality of configurations and configures the ADC system according to the selected configuration. The quantizer assembly is configurable to provide a plurality of quantization stages arranged in series in a first configuration, or to provide a single quantization stage in a second configuration.

In accordance with another aspect of the present invention, a method is provided for configuring a programmable ADC. At least a first configuration and a second configuration are selected between. The first configuration is characterized in that a quantizer assembly associated with the programmable ADC is configured into a single quantization stage. The second configuration is characterized in that the quantizer assembly is configured into a plurality of quantization stages, with at least two of the plurality of quantization stages configured in series. The quantizer assembly is configured according to the selected configuration.

DETAILED DESCRIPTION OF INVENTION

The present invention relates to systems and methods for configuring a programmable analog-to-digital converter (ADC). In accordance with an aspect of the invention, the ADC is operative to assume a plurality of configurations by selectively coupling various components of the ADC according to the selected configurations and programming or configuring the coupled components. The components include a quantizer assembly that can be configured to assume one or multiple quantization stages. In at least one configuration, the quantizer assembly can be configured to form multiple quantization stages arranged in series. The quantizer assembly and one or more other programmable or configurable components can be configured by a configuration control according to the selected configuration. By switching between the plurality of configurations, it is possible to optimize one or more performance parameters of the ADC, as each configuration has associated advantageous and disadvantageous features with respect to the performance parameters. Having a programmable ADC enables a single system to be employed in a very wide array of applications calling for different bandwidths and/or dynamic range levels. A system that can change parameters in near-real time can be adaptively optimized to the signals present or that are anticipated.

Figure 1:
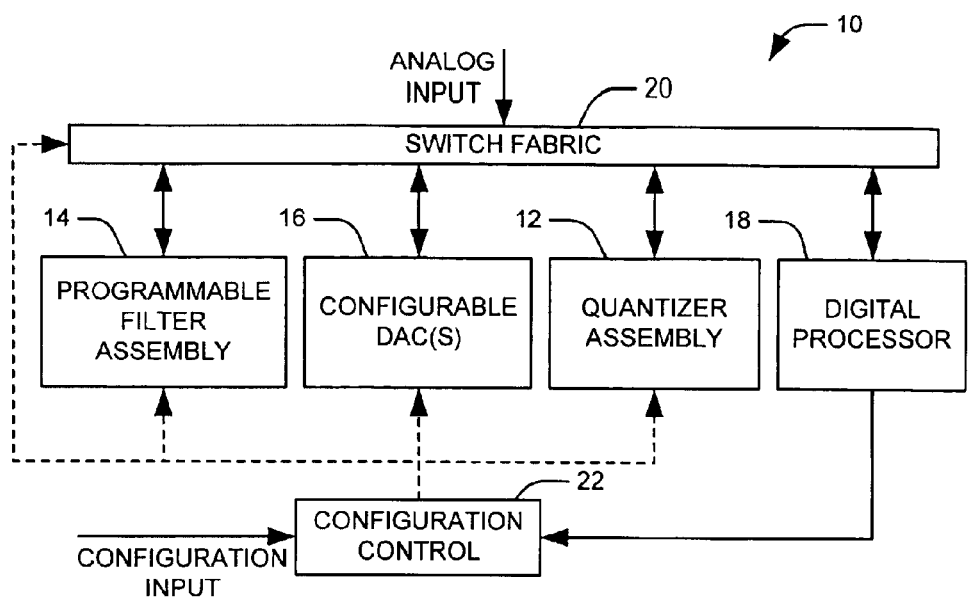
FIG. 1 illustrates a programmable analog-to-digital converter (ADC) system in accordance with an aspect of the invention.

FIG. 1 illustrates a programmable analog-to-digital converter (ADC) system 10 in accordance with an aspect of the invention. The programmable ADC system 10 comprises a plurality of components, including a quantizer assembly 12, a programmable filter assembly 14, one or more configurable digital-to-analog converters (DACs) 16, and a digital processor 18. The components can be coupled and uncoupled by a switch fabric 20 that can be configured by a configuration control 22 to select any of a plurality of configurations associated with the ADC system 10. Each configuration can comprise a characteristic coupling between the components 12, 14, 16, and 18 by the switch fabric 20, as well as characteristic profiles of configuration data provided to the quantizer assembly 12, the programmable filter assembly 14, and the DACs 16.

For example, the quantizer assembly 12 can be configured to form one or more quantization stages. The quantizer assembly 12 can comprise a plurality of comparators that can be configured into groups to form the one or more quantization stages. It will be appreciated that the quantizer assembly can be configured to provide a single quantization stage, multiple parallel quantization stages, multiple serial quantization stages, and multiple quantization stages arranged as a combination of serial and parallel stages. The quantizer assembly can be made adaptive, such that the quantization noise and dynamic range of each stage is tailored depending on a a characteristic of the input signal such as amplitude or frequency. For example, threshold voltages for the comparators in each quantization stage can be provided by the configuration control 22 to set associated quantization levels for each stage. A quantization stage can have an associated sample and hold (not shown) that controls the rate at which samples are provided to the quantization stage.

In accordance with an aspect of the invention, the quantizer assembly 12 can be configured to comprise two or more stages in series. This allows the programmable ADC system 10 to assume one or more configurations having multiple conversion stages, such as a half-flash arrangement or a cascaded delta-sigma ADC arrangement. The switch fabric 20 can cooperate with the quantizer assembly 12 to provide the digital output of a first quantization stage as an intermediate signal to a component associated with a second quantization stage. For example, this signal can be provided to the programmable DACs 16 to convert the digital output to an intermediate analog signal, which becomes a second analog signal for conversion, after appropriate preprocessing, at the second quantization stage. This can be continued for additional stages after the second, if desired.

For a given configuration, the programmable filter assembly 14 can be configured to form zero, one, or multiple noise shaping filters. A given noise shaper filter works in combination with a respective quantization stage as a delta-sigma modulator to create one or more low noise frequency bands in the resulting digital signal at the cost of creating concentrations of quantization noise in other portions of the frequency spectrum. The programmable filter assembly 14 can be programmed by the configuration control to adjust the shape of the low noise frequency bands created by a given noise shaper. The shape of the low noise frequency bands can be altered by changing circuit values (e.g., variable resistive and/or capacitive components) inside the programmable filter assembly 14. In an exemplary implementation, the programmable filter assembly 14 can comprise a plurality of noise shaping stages, with the available noise shaping stages being configured via switches or multiplexes, such that they are divided among the desired number of noise shaping filters.

The programmable ADC system 10 can also comprise one or more configurable digital-to-analog converters (DACs) 16. A given DAC can be configured by the configuration control to alter its effective resolution. For example, the configurable DACs 16 can be configured via variable resistor ladders, current switches, or similar circuitry.

A digital processor 18 receives one or more digital outputs from the quantizier assembly. The digital processor 18 can include one or more of components for combining plural digital signals, decimation filters for reconstructing a delta-sigma modulated signal, and digital demodulation components for extracting information from an information carrying signal. The programmable ADC system 10 can also include a number of miscellaneous circuit components not illustrated in FIG. 1. For example, the ADC system 10 can include summing nodes, sample and hold elements, delay blocks, and gain elements as needed to support the plurality of configurations. The ADC system 10 can also include a clock circuit to synchronize various components within the system.

By switching the programmable ADC system 10 between configurations, it is possible to emphasize one or more performance characteristics of the ADC 10 using a standardized assembly. For example, by configuring the system as a standard flash ADC, the speed of the conversion is emphasized at the cost of increased power consumption. If the increased speed becomes less important to the application, the ADC can be reconfigured to a multiple stage half-flash ADC or a delta-sigma modulated ADC to decrease the power consumption at the cost of conversion speed. The system can be configured by a user or can be made adaptive to one or more characteristics of the input signal. For example, the digital processor 18 can provide feedback data to the configuration control 22 to facilitate the selection of an ADC configuration. The configuration control can utilize the feedback data in combination with configuration data to determine an optimal configuration for the system.

Figure 2:
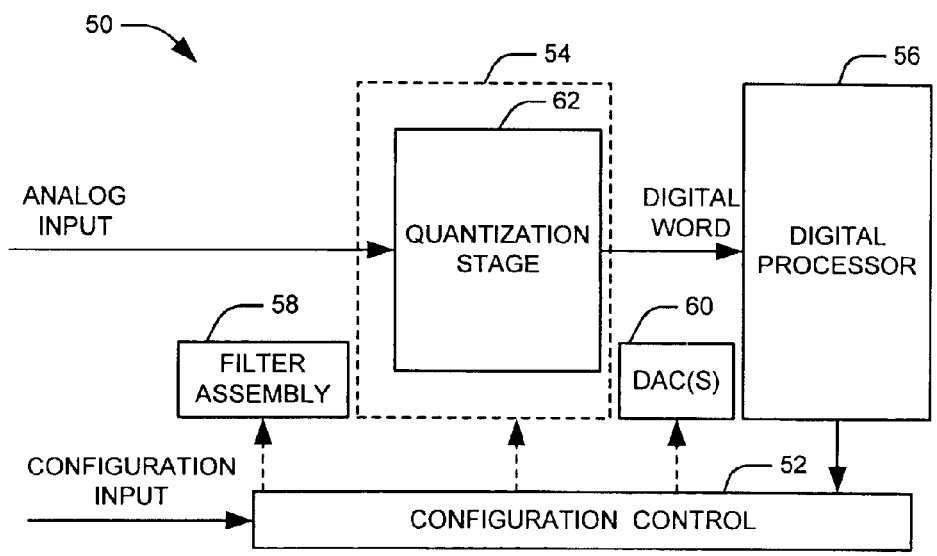
FIG. 2 illustrates an exemplary configuration of a programmable ADC as a single stage flash ADC in accordance with an aspect of the present invention.

FIG. 2 illustrates an exemplary configuration 50 of the programmable ADC as a single stage flash ADC in accordance with an aspect of the present invention. A single stage flash ADC configuration provides a maximum conversion speed (e.g., maximum bandwidth) for the converter at the cost of relatively high power consumption and a moderate degree of non-linear behavior in the ADC. In the illustrated configuration, a switch fabric (not shown) associated with the programmable ADC is configured by a configuration control 52 to couple a quantizer assembly 54 with a digital processor 56. The switch fabric is configured to bypass or uncouple a programmable filter assembly 58 and one or more configurable DACs 60 from an information stream comprising the quantizer 54 assembly and the digital processor 56. It will be appreciated that the power supply to the programmable filter assembly 58 and the DACs 60 can be disconnected when the ADC is in the illustrated configuration to reduce the overall power consumption of the assembly.

In the illustrated configuration, the quantizer assembly 54 is configured according to control data from the configuration control 52 to comprise a single quantization stage 62. For example, the configuration control 52 can select switch positions within the quantizer assembly 54, such that a plurality of comparators associated with the quantizer assembly receive an analog input in parallel. The configuration control 52 can also provide suitable threshold voltages for the plurality of comparators, such that their output provides a meaningful digital word representing the input signal. The quantizer assembly 54 can be associated with one or more sample and hold components (not shown). A sample and hold component can sample the analog signal and provide it to the quantization stage 62 at a desired rate. The sample rate can be controlled by the configuration control 52 via a clock circuit (not shown) or similar mechanism.

The digital word can be provided to the digital processor 56 for additional processing. For example, the digital processor 56 can analyze the digital word to determine one or more characteristics of the analog input signal. Data relating to the one or more characteristics can be provided to the configuration control 52 as feedback. The configuration control 52 can utilize the provided feedback and user provided configuration data to adaptively select an optimal configuration for the ADC according to the determined signal characteristics.

Figure 3:
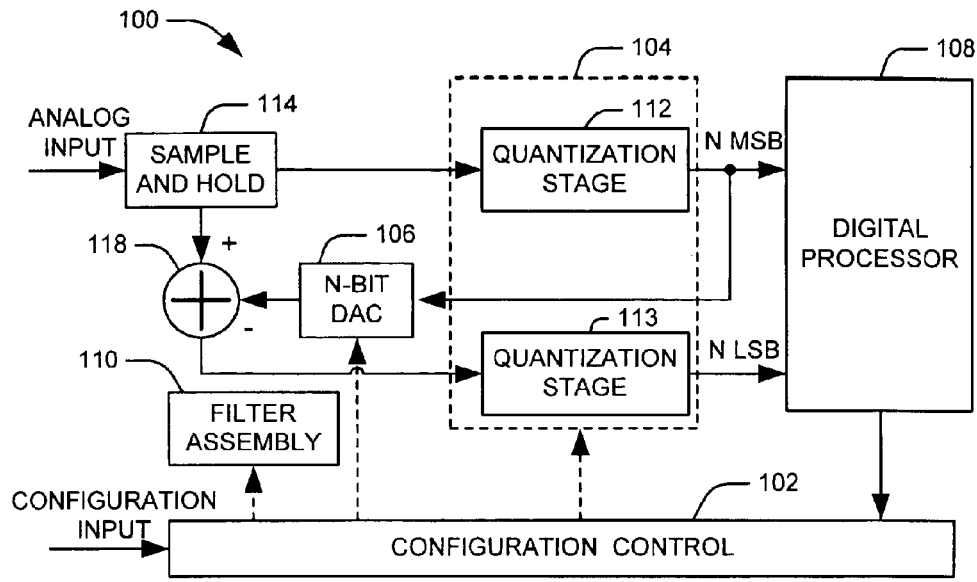
FIG. 3 illustrates an exemplary configuration of a programmable ADC as a two-stage flash ADC in accordance with an aspect of the present invention.

FIG. 3 illustrates an exemplary configuration 100 of the programmable ADC as a two-stage flash ADC in accordance with an aspect of the present invention. A multiple stage flash ADC configuration provides a reduced conversion speed as compared with the single stage ADC and introduces the possibility of additional error due to its increased complexity (e.g., increased number of components, added DAC conversion), but provides reduced power consumption and the use of a much smaller quantizer can provide superior linearity over a single stage. In the illustrated configuration, a switch fabric associated with the programmable ADC is configured by a configuration control 102 to couple a plurality of components including a quantizer assembly 104, a configurable DAC 106, and a digital processor 108. The switch fabric is configured to bypass or uncouple a programmable filter assembly 110 associated with the ADC from the information stream. It will be appreciated that the power supply to the programmable filter assembly 110 can be removed when the ADC is in the illustrated configuration to reduce the overall power consumption of the system.

In the illustrated example, the quantizer assembly 104 is configured as a first quantization stage 112 and a second quantization stage 113. In the illustrated example, the first quantization stage 112 and the second quantization stage 113 are each configured as N-bit quantizers, with a digital output signal corresponding to the analog input signal comprising 2N bits. It will be appreciated that the quantizer assembly 104 can be configured to provide more than two quantization stages, and the comparators comprising the quantization stages 112 and 113 can be allocated differently to provide a different number of effective bits at each quantization stage. The configuration control 102 can adjust threshold voltages associated with the first quantization stage 112, such that the first quantization stage can provide the N most significant bits of a digital output signal corresponding to the analog signal.

An analog signal is provided to a sample and hold component 114 associated with the first quantization stage 112. The sample and hold component 114 samples the analog signal, holding the sample in a buffer and providing a copy of the sample to the first quantization stage 112 at a desired rate. The sample rate can be controlled by the configuration control 102 via a clock circuit (not shown) or similar mechanism. The first quantization stage 112 quantizes the analog signal to determine the N most significant bits of the corresponding digital output signal. The N most significant bits are provided to the digital processor as a first digital output.

The first digital output is also fed back to the configurable DAC 106. The configurable DAC 106 is configured by the configuration control 102 to accept an N-bit digital word and convert it into an analog signal representing the first digital output. This can be accomplished, for example, by adjusting variable resistor ladders within the configurable DAC 106. The output of the DAC 106 is provided as one input to a difference element 118. The buffered analog signal in the sample and hold 114 is provided as a second input to the difference element 118. The difference element subtracts the DAC output from the original analog input signal to produce an intermediate input signal.

The intermediate input signal is provided to the second quantization stage 113. The second quantization stage 113 can also have an associated sample and hold or similar component (not shown) driven by a clock circuit to control the rate at which samples are provided for quantization. The second quantization stage 113 is appropriate configured (e.g., provided with desired threshold voltages) to quantize an analog signal, such as the intermediate analog signal, having a voltage less than the maximum value that can be represented by the N least significant bits of the digital output signal. The second quantization stage 113 quantizes the intermediate analog signal to produce a second digital output corresponding to the N least significant bits of the digital output signal.

The second digital output is provided to the digital processor 108. The digital signal processor 108 can comprise a digital adder or latch for combining the first and second digital outputs. Similarly, the digital processor 108 can analyze the first and second digital inputs to determine one or more characteristics of the analog input signal. Data relating to the one or more characteristics can be provided to the configuration control 102 as feedback. The configuration control 102 can utilize the provided feedback and user provided configuration data to adaptively select an optimal configuration for the ADC according to the determined signal characteristics.

Figure 4:
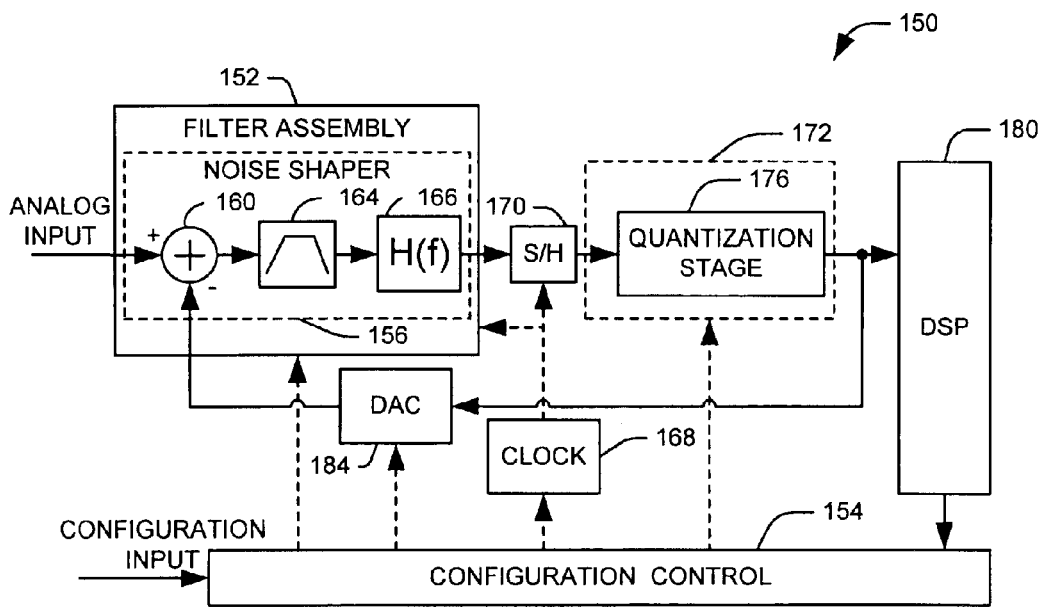
FIG. 4 illustrates an exemplary configuration of a programmable ADC as a single stage delta-sigma modulated ADC in accordance with an aspect of the present invention.

FIG. 4 illustrates an exemplary configuration 150 of the programmable ADC as a single stage delta-sigma modulated ADC in accordance with an aspect of the present invention. The single stage delta-sigma ADC can comprise two different arrangements, a first utilizing a multi-bit quantizer and the second utilizing a single-bit quantizer. A single-bit delta-sigma ADC provides a high dynamic range and extreme linearity over a limited bandwidth. The multi-bit delta-sigma ADC sacrifices some of the linearity of the single-bit configuration to provide an even higher dynamic range for the conversion. In the illustrated example, an analog input signal is received at a programmable filter assembly 152. A switch fabric (not shown) is controlled by a configuration control 154 to configure the programmable filter assembly as a noise shaper 156. At the noise shaper 156, the analog signal is provided to a difference element 160 that subtracts a modulator feedback signal from the analog signal. The resulting signal is then passed to a tunable/selectable filter 164.

The tunable/selectable filter 164 filters the analog signal along one or more desired passbands and provides the filtered signal to a noise shaping filter 166. In the exemplary implementation, the tunable/selectable filter 164 attenuates out-of-band quantization noise introduced by the feedback signal. The tunable/selectable filter 164 can comprise one or more filters, representing multiple passbands of interest. For example, the tunable/selectable filter 164 can comprise a surface acoustic wave (SAW) filter that can be electronically configured by the configuration control 154 to configure one or more micromechanical components that define its one or more associated passband frequencies. Other tunable or selectable filters having similar frequency agility can be utilized in accordance with one or more aspects of the invention.

The noise shaping filter 166 applies a transfer function, H(f), to the analog signal that shifts quantization noise to frequencies outside of a frequency band of interest. This creates one or more high dynamic range (e.g., low noise) frequency bands in which a signal can be converted without significant quantization noise. Frequency characteristics associated with the high dynamic range bands can be altered according to configuration input from the configuration control 154. In accordance with an aspect of the present invention, values associated with the noise shaping filter 166 can be programmable (e.g., tunable/selectable) such that the values can be altered by a control signal from the configuration control 154.

The low noise regions correspond to zeros within the transfer function, H(f), associated with the noise shaping filter 166. The width and dynamic range of a particular band can be changed by shifting the placement of one or more low noise regions associated with the noise shaper 156. For example, the noise shaping filter 166 can be controlled to further increase the dynamic range of a particular high dynamic range region by overlapping multiple zeroes at a particular frequency. It is to be appreciated that the noise shaping filter 166 and other components of the first noise shaper 156 can be constructed with discrete time or continuous time circuits, either of which can be made tunable. An internal sample and hold (S/H) circuit (not shown) and an accordant signal from a clock circuit 168 can be employed as needed.

The output of the noise shaper 156 is provided to a sample and hold 170. The sample and hold 170 holds a sample of the shaped signal and provides the sampled signal to a quantizer assembly 172. The sample and hold 170 is operatively connected to the clock circuit 168, such that the output of the noise shaper is sampled at a desired rate. The desired rate can correspond to desired center frequencies of the one or more low noise bands generated by the noise shaper 156. In the illustrated example, the clock circuit 168 can comprise a digital frequency synthesizer. The clock circuit 168 can receive control input from the configuration control 154 to allow the desired sample rate to be changed across configurations or even within a given configuration.

In the illustrated configuration, the quantizer assembly 172 is configured according to control data from the configuration control 154 to comprise a single quantization stage 176. For example, the configuration control 154 can select switch positions within the quantizer assembly 172, such that a plurality of comparators associated with the quantizer assembly receive an analog input in parallel to assume a multi-bit configuration. The configuration control 172 can provide suitable threshold voltages for the plurality of comparators, such that their output provides a meaningful digital word representing the input signal. Similarly, the configuration control 154 can configure the quantizer assembly 172 to provide a single-bit quantization stage comprising a single comparator having an associated threshold value. The quantization stage 176 quantizes the analog signal according to its selected configuration and provides a digital output to a digital signal processor 180.

The digital signal processor 180 processes the digital output to reconstruction an information bearing signal. For example, the digital output can be provided to a decimation filter within the digital signal processor 180 that transforms the relatively high sample rate output signal into a signal having a lower sample rate, but a larger word size. The digital signal processor 180 can also analyze the digital outputs to determine one or more characteristics of the analog input signal. Data relating to the one or more characteristics can be provided to the configuration control 154 as feedback. The configuration control 154 can utilize the provided feedback and user provided configuration data to adaptively provide an optimal configuration for the ADC according to the determined signal characteristics.

The first digital output is also fed back to a configurable DAC 184 and provided to the noise shaper 156 as the modulator feedback signal at the difference element 160. It will be appreciated that the configurable DAC 184 can be configured to assume any of a number of associated bits of effective resolution, to match the configuration of the quantization stage 176. For example, variable resistor ladders within the DAC 184 can be configured by the configuration control 154 to provide a single-bit DAC or a multi-bit DAC having a desired effective input word size. It will be appreciated, however, that the use of a multi-bit configuration of the DAC 184 to provide feedback to the noise shaper 156 can result in an increased non-linear behavior within the ADC.

To minimize the non-linear behavior resulting from a multi-bit DAC configuration, the configurable DAC 184 can comprise a delta-sigma modulator (not shown). The delta-sigma modulator filters and quantizes a multi-bit digital output to produce a one-bit signal having one or more narrow frequency bands that are substantially free of quantization noise. The delta-sigma modulator is configurable by the configuration control 154 to accept digital inputs of varying word sizes. The delta-sigma modulator can be driven by the clock circuit such that the low noise frequency bands of the delta-sigma modulator match the frequency bands associated with the noise shaper 156. The output from the delta-sigma modulator can be provided to a standard one-bit DAC. One-bit DACs are inherently linear in operation, eliminating problems associated with non-linearity within the feedback loop of a multi-bit delta-sigma ADC arrangement. The output of the one-bit DAC can then provide the modulation feedback signal to the difference element 160. It is to be further appreciated that circuitry in the DAC 184 or in the quantization assembly 172 that is not required for a particular application can be disconnected or placed in a stand-by mode.

Figure 5:
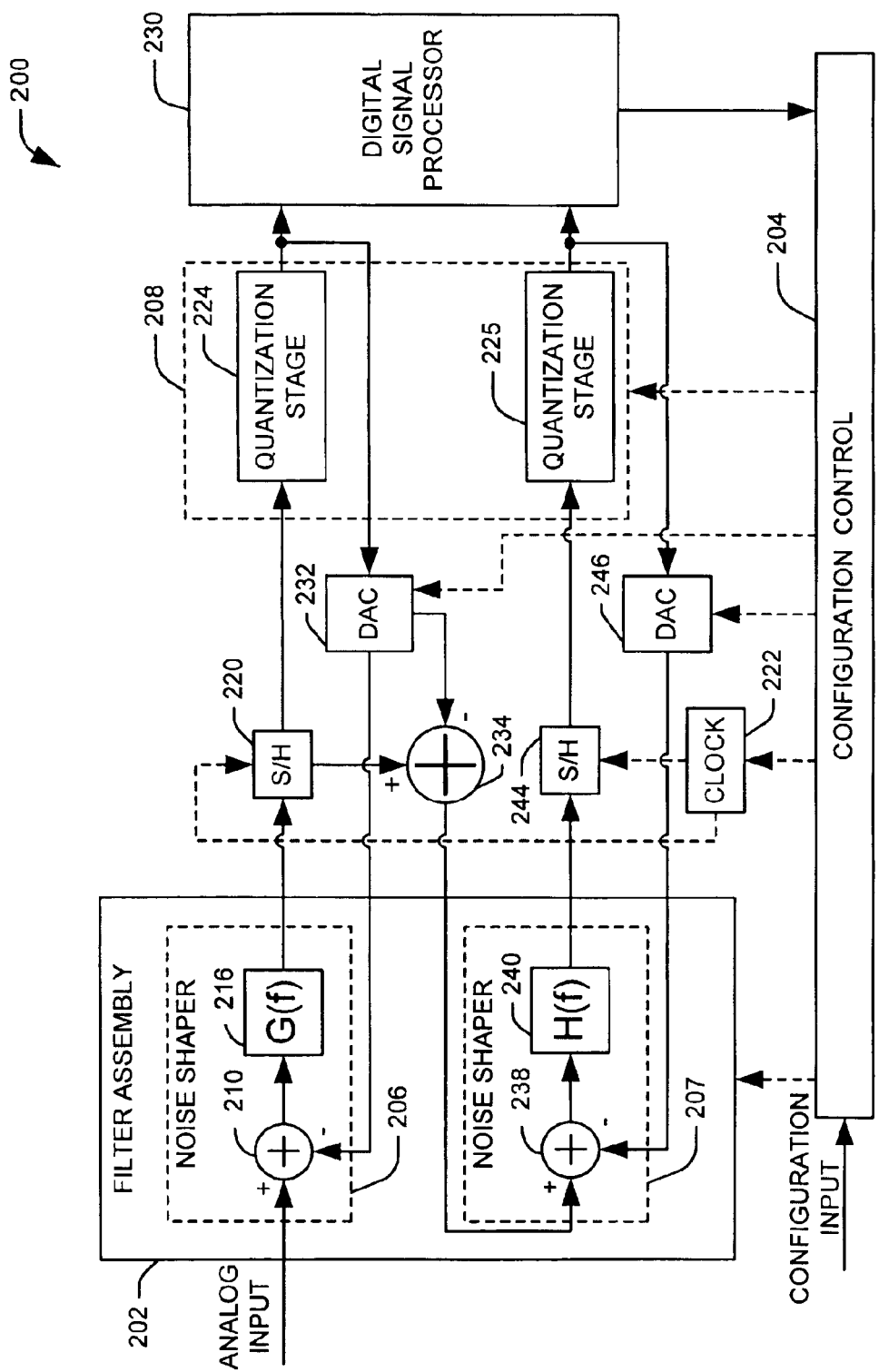
FIG. 5 illustrates an exemplary configuration of a programmable ADC as a two-stage cascaded delta-sigma modulated ADC in accordance with an aspect of the present invention.

FIG. 5 illustrates an exemplary configuration 200 of the programmable ADC as a two stage cascaded delta-sigma modulated ADC in accordance with an aspect of the present invention. The cascaded delta-sigma ADC provides a comprise between the multi-bit and the single-bit delta-sigma ADC arrangements, providing a superior dynamic range to the single-bit ADC, while introducing less non-linearity to the conversion process than an multi-bit ADC. An analog input signal is received at a programmable filter assembly 202. A switch fabric (not shown) is controlled by a configuration control 204 to configure the programmable filter assembly in a first noise shaper 206 and a second noise shaper 207.

The analog input signal is received at the first noise shaper 206. The noise shapers 206 and 207 can comprise one or more stages, limited only by practical considerations. The first noise shaper 206 filters the analog signal as to shape the quantization noise produced by a quantizer assembly 208 into frequencies outside of a band of interest. The programmable filter assembly 202 receives configuration input from the configuration control 204 to control the shaping behavior of the noise shapers values for one or more variable elements, such as register values, for one or more components of the programmable filter assembly 202 to define the shape or location of one or more low noise frequency bands associated with the first noise shaper 206 and the second noise shaper 207.

At the first noise shaper 206, the analog signal is provided to a first difference element 210 that subtracts a first feedback signal from the analog input signal. The resulting signal is then passed to a first noise shaping filter 216. The noise shaping filter 216 applies a transfer function, G(f), to the analog signal that shifts quantization noise to frequencies outside of a frequency band of interest. This creates one or more high dynamic range (e.g., low noise) frequency bands in which a signal can be converted without significant quantization noise. Frequency characteristics associated with the high dynamic range bands can be altered according to configuration input from the configuration control 204. In accordance with an aspect of the present invention, values associated with the noise shaping filter 216 can be programmable (e.g., tunable/selectable) such that the values can be altered by a control signal from the configuration control 204.

One or more null regions correspond to zeros within the transfer function, G(f), associated with the noise shaping filter 216. The width and dynamic range of a particular band can be changed by shifting the placement of the null regions associated with the first noise shaper 206. For example, the noise shaping filter 216 can be controlled to further increase the dynamic range of a particular high dynamic range region by overlapping multiple zeroes at a particular frequency. It is to be appreciated that the noise shaping filter 216 and other components of the first noise shaper 206 can be constructed with discrete time or continuous time circuits, either of which can be made tunable.

The output of the first noise shaper 206 is provided to a first sample and hold component 220. The sample and hold component 220 samples the analog signal at a desired rate, holding the sample in a buffer and providing a copy of the sample to the quantizer assembly 208 at a desired rate. The desired sample rate can correspond to desired center frequencies of the one or more low noise bands generated by the noise shaper 206. The sample rate can be controlled by the configuration control 204 via a clock circuit 222. The clock circuit 222 can receive control input from the configuration control 204 to allow the desired sample rate to be changed across configurations or even within a given configuration. In an exemplary embodiment, the clock circuit 222 can comprise a digital frequency synthesizer.

In the illustrated example, the quantizer assembly 208 comprises an array of comparators, configured according to control input from the configuration control 204 into a first quantization stage 224 and a second quantization stage 225. In the illustrated example, the first quantization stage 224 includes an N-bit quantizer, where N is an integer greater than one, and the second quantization stage 225 comprises a single-bit quantizer. The configuration control 204 can adjust threshold voltages for the array of comparators to desired values to control the effective resolution of the first and second quantization stages 224 and 225. It will be appreciated that the quantizer assembly 208 can be configured to provide more than two quantization stages, and the comparators comprising the quantization stages 224 and 225 can be allocated differently to provide a different number of effective bits at each quantization stage. The first quantization stage 224 quantizes the output of the first noise shaper 206 to produce a first digital output, which is provided to a digital signal processor 230.

The first digital output is converted to an analog signal at a first configurable DAC 232 and provided to the first noise shaper 206 as the first feedback signal at the first difference element 210. It will be appreciated that the first DAC 226 can be configured to assume any of a number of associated bits of effective resolution, to match the effective resolution of the first quantization stage 224. For example, the first DAC 232 can comprise a delta-sigma modulator that can be configured to accept a desired bit size, as described above with respect to FIG. 4. Alternatively, variable resistor ladders within the DAC 232 can be configured by the configuration control 204 to provide the desired resolution. The first feedback signal is also provided to an intermediate difference element 234 as a first input.

The buffered signal in the first sample and hold 220 is provided as a second input to the intermediate difference element 234. The intermediate difference element 234 subtracts the first feedback signal from the buffered signal to provide an intermediate analog signal. The intermediate analog signal is provided to the second noise shaper 207 as an input at a second difference element 238. A second feedback signal is subtracted from the intermediate analog signal at the second difference element 238. The resulting signal is provided to a second noise shaper 240. The second noise shaping filter 240 filters the resulting signal with a transfer function, H(f), to redistribute quantization noise associated with the second quantization stage 225. This creates one or more high dynamic range (e.g., low noise) frequency bands in which the signal can be converted without significant quantization noise. It will be appreciated that the second noise shaper 207 can be configured by the configuration control 204 such that its associated high-dynamic range frequency bands match those associated with the first noise shaper 206.

The shaped signal is provided to a second sample and hold 244 which samples the signal according to a desired sample rate and provides the samples to the second quantization stage 225. The sample rate can be controlled by the configuration control 204 via the clock circuit 222. The second quantization stage 225 converts the signal into a second digital output, comprising a high-sample rate single-bit digital signal. The second digital output is provided to the digital signal processor 230 and fed back to a second DAC 246. It will be appreciated that the second DAC 246 can be configurable to match the effective resolution of the second quantization stage 225. In the illustrated example, the second DAC 246 is configured as a single-bit DAC. The output of the DAC 246 is provided to the second difference element 238 as the second feedback signal.

The digital signal processor 230 processes the first digital output and the second digital output to provide a unified digital signal representing the analog input signal. For example, the digital signal processor 230 can comprise a digital adder or latch for combining the first and second digital outputs. Similarly, the digital outputs can be provided to a decimation filter within the digital signal processor 230 that transforms the relatively high sample rate output signal into a signal having a lower sample rate, but a larger word size. The digital signal processor 230 can also analyze the digital outputs to determine one or more characteristics of the analog input signal. Data relating to the one or more characteristics can be provided to the configuration control 204 as feedback. The configuration control 204 can utilize the provided feedback and user provided configuration data to adaptively provide an optimal configuration for the ADC according to the determined signal characteristics.

Figure 6:
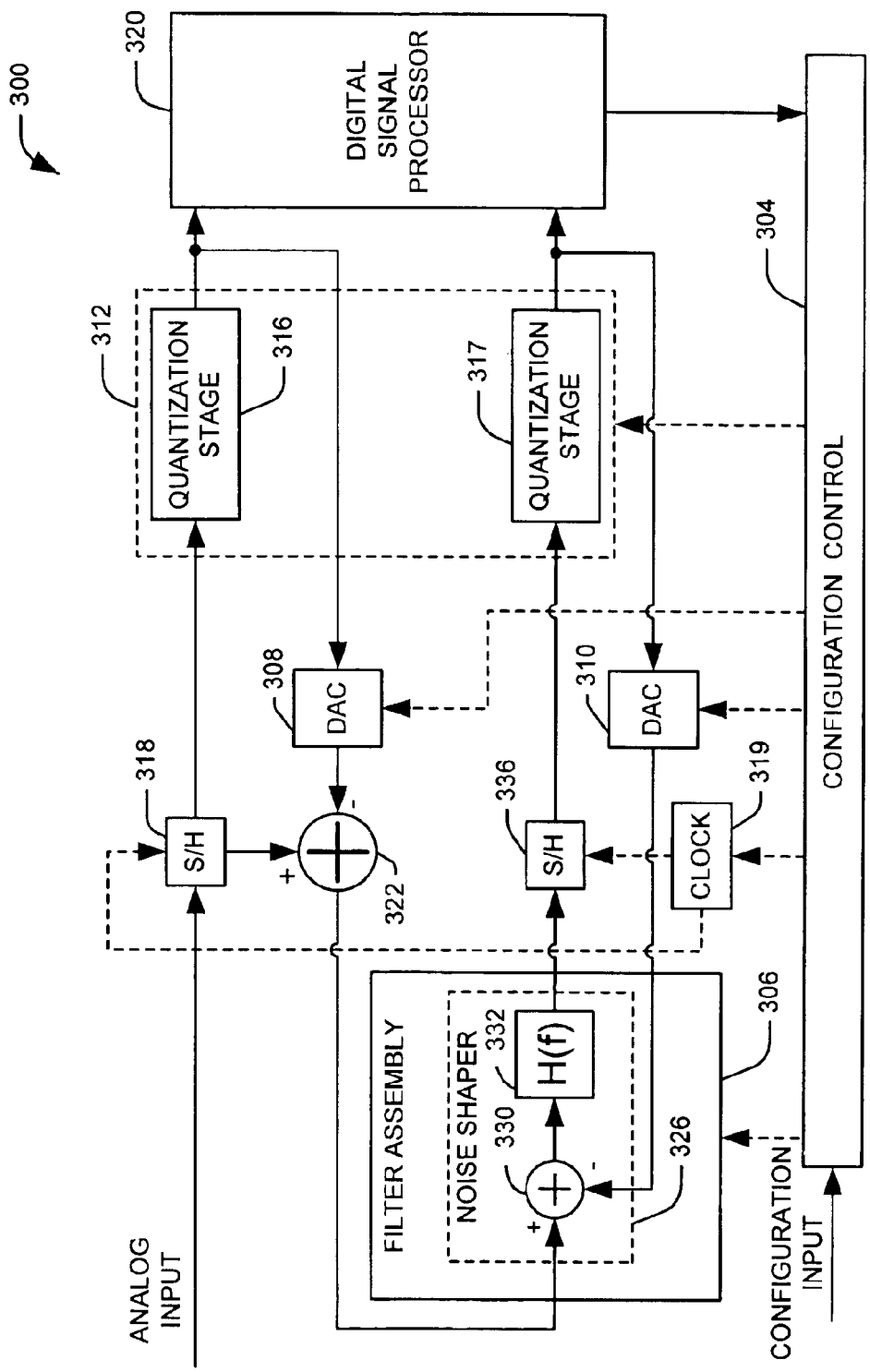
FIG. 6 illustrates an exemplary configuration of a programmable ADC as a two-stage hybrid ADC in accordance with an aspect of the present invention.

FIG. 6 illustrates an exemplary configuration 300 of the programmable ADC as a two stage hybrid ADC, including a multi-bit flash conversion and a single-bit delta-sigma modulated conversion stage in accordance with an aspect of the present invention. Hybrid ADC arrangements can offer additional flexibility in optimizing various performance parameters of the ADC. For example, in the illustrated example, a dynamic range associated with the delta-sigma modulated conversion stage is enhanced by the presence of the flash conversion stage. In one implementation, the presence of the flash conversion stage can increase the overall dynamic range of the ADC by approximately six decibels for each bit of resolution in the flash conversion. In the illustrated example, a switch fabric (not shown) is controlled by a configuration control 304 to couple a plurality of components associated with the configuration, including a filter assembly 306, a first configurable DAC 308 and a second configurable DAC 310, and a quantizer assembly 312.

In the illustrated example, the quantizer assembly 312 comprises an array of comparators, configured according to control input from the configuration control 304 into a first quantization stage 316 and a second quantization stage 317. In the illustrated example, the first quantization stage 316 includes an N-bit quantizer, where N is an integer greater than one, and the second quantization stage 317 comprises a single-bit quantizer. The configuration control 304 can adjust threshold voltages for the array of comparators to desired values to control the effective resolution of the first and second quantization stages 316 and 317. It will be appreciated that the quantizer assembly 312 can be configured to provide more than two quantization stages, and the comparators comprising the quantization stages 316 and 317 can be allocated differently to provide a different number of effective bits at each quantization stage.

The analog input signal is provided to a first sample and hold component 318 associated with the first quantization stage 316. The sample and hold component 318 samples the analog signal, holding the sample in a buffer and providing a copy of the sample to the first quantization stage 316 at a desired rate. The sample rate can be controlled by the configuration control 304 via a clock circuit 319. The analog input signal is provided to the first quantization stage 316 from the first sample and hold 318. The first quantization stage 316 quantizes the analog input signal to produce a first digital output, which is provided to a digital signal processor 320.

The first digital output is fed back to the first DAC 308 and converted to an analog signal to provide a first input to an intermediate difference element 322. It will be appreciated that the first DAC 308 can be configurable to assume any of a number of associated bits of effective resolution, to match the effective resolution of the first quantization stage 316. For example, variable resistor ladders within the first DAC 308 can be configured by the configuration control 304 to provide the desired resolution. The buffered signal in the first output sample and hold is provided as a second input to the intermediate difference element 322. The intermediate difference element 322 subtracts the first feedback signal from the buffered signal to provide an intermediate analog signal.

The intermediate analog signal is provided to the programmable filter assembly 306. The programmable filter assembly 306 is configured by a configuration control 304 to configure the programmable filter assembly into a noise shaper 326 operative in combination with the second quantization stage 317 to act as a delta-sigma modulated ADC. The noise shaper 326 filters the intermediate analog signal as to shape the quantization noise produced by the second quantization stage 317 into frequencies outside of one or more bands of interest. The configuration control 304 can provide appropriate register values for one or more components of the programmable filter assembly 306 to define one or more low noise frequency bands associated with the noise shaper 326.

At the noise shaper 326, the analog signal is provided to a difference element 330 that subtracts a modulator feedback signal from the analog input signal. The resulting signal is then passed to a noise shaping filter 332. The noise shaping filter 332 applies a transfer function, H(f), to the analog signal that shifts quantization noise to frequencies outside of a frequency band of interest. This creates one or more high dynamic range (e.g., low noise) frequency bands in which a signal can be converted without significant quantization noise. Frequency characteristics associated with the high dynamic range bands can be altered according to configuration input from the configuration control 304. In accordance with an aspect of the present invention, values associated with the noise shaping filter 332 can be programmable (e.g., tunable/selectable) such that the values can be altered by a control signal from the configuration control 304.

The low noise regions correspond to zeros within the transfer function associated with the noise shaping filter 332. The width and dynamic range of a particular band can be changed by shifting the placement of one or more low noise regions created by the noise shaper 326. For example, the noise shaping filter 332 can be controlled to further increase the dynamic range of a particular high dynamic range region by overlapping multiple zeroes at a particular frequency. It is to be appreciated that the noise shaping filter 332 and other components of the noise shaper 326 can be constructed with discrete time or continuous time circuits, either of which can be made tunable.

The noise shaped signal is provided to a second sample and hold 336 which samples the signal according to a desired sample rate and provides the samples to the second quantization stage 317. The desired sample rate can correspond to desired center frequencies of the one or more low noise bands generated by the noise shaper 326. The sample rate can be controlled by the configuration control 304 via the clock circuit 319. The second quantization stage 317 converts the signal into a second digital output, comprising a high sample rate single-bit digital signal. The second digital output is provided to the digital signal processor 320 and fed back to the second DAC 310. It will be appreciated that the second DAC 310 can be configurable to match the effective resolution of the second quantization stage 317. In the illustrated example, the second DAC 310 is configured as a single-bit DAC. The output of the second DAC 310 is provided to the difference element 330 as the modulator feedback signal.

The digital signal processor 320 processes the first digital output and the second digital output to provide a unified digital signal representing the analog input signal. For example, the second digital output can be provided to a decimation filter within the digital signal processor 320 that transforms the relatively high sample rate output signal into a signal having a lower sample rate, but a larger word size. The digital signal processor 320 can comprise a digital adder or latch for combining the first digital output with the second digital output or the output of the decimation filter. The digital signal processor 320 can also analyze the digital outputs to determine one or more characteristics of the analog input signal. Data relating to the one or more characteristics can be provided to the configuration control 304 as feedback. The configuration control 304 can utilize the provided feedback and user provided configuration data to adaptively provide an optimal configuration for the ADC according to the determined signal characteristics.

Figure 7:
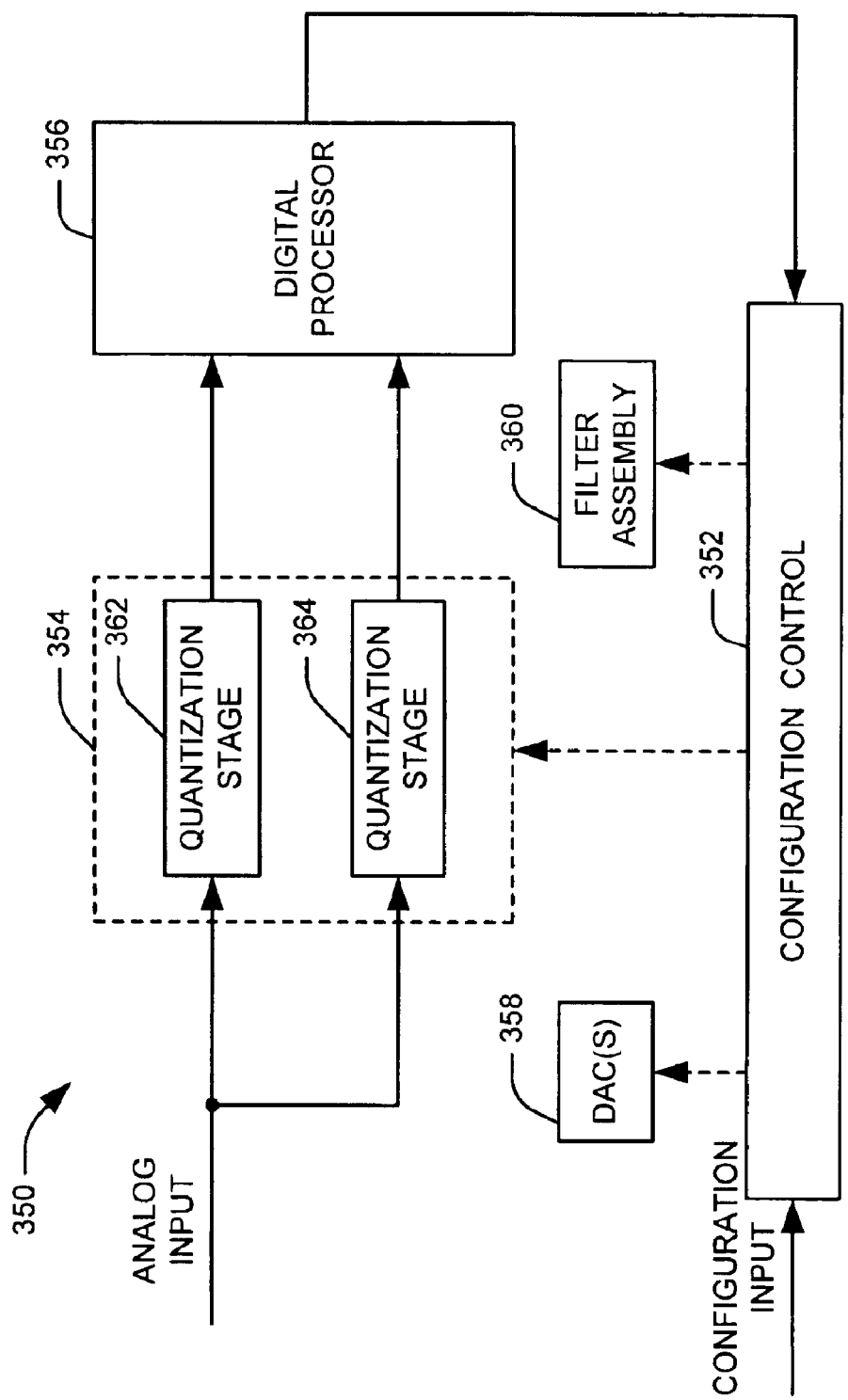
FIG. 7 illustrate an exemplary configuration of parallel data conversion.

FIG. 7 illustrates an exemplary configuration 350 of parallel data conversion. It employs the programmable ADC as a multi-range flash ADC in accordance with an aspect of the present invention. A parallel ADC configuration, where each stage has tailored dynamic range and quantization noise levels, having multiple amplitude ranges can provide extreme dynamic range for signal conversion, but the configuration experiences significant quantization noise for high amplitude signals. An ADC configuration having multiple frequency ranges (each preceded by a filter stage) can provide wideband signal conversion while facilitating the use of associated components (e.g., noise shapers) that can limit the effect bandwidth of the ADC. In the illustrated configuration, a switch fabric (not shown) associated with the programmable ADC is configured by a configuration control 352 to couple a quantizer assembly 354 with a digital processor 356. The switch fabric is configured to bypass or uncouple a programmable filter assembly 358 and one or more configurable DACs 360 from an information stream comprising the quantizer 354 assembly and the digital processor 356. It will be appreciated that the power supply to the programmable filter assembly 358 and the DACs 360 can be disconnected when the ADC is in the illustrated configuration to reduce the overall power consumption of the assembly. It will be further appreciated that any stage in a parallel data converter can be a flash converter or any of the other configurations described in the present invention. In addition to optimizing the dynamic range of each stage, it is possible that the bandwidth and passband of each stage will be tailored.

In the illustrated configuration, the quantizer assembly 354 is configured according to control data from the configuration control 352 to comprise a first quantization stage 362 and a second quantization stage 364. It will be appreciated that the quantizer assembly 354 can be configured to provide more than two quantization stages. Resources (e.g., comparators) within the quantization assembly can be adaptively allocated according to the configuration data to distribute an available number of bits of resolution at the quantizer assembly 354 between the first and second quantization stages 362 and 364. The quantizer assembly 354 can be associated with one or more sample and hold components (not shown). For example, respective sample and hold components associated with the first and second quantization stages 362 and 364 can sample an analog input signal and provide their respective quantization stages at a desired rate. The sample rate can be controlled by the configuration control 352 via a clock circuit (not shown) or similar mechanism.

An analog input signal is provided to the first and second quantization stages 362 and 364 in parallel. Each quantization stage quantizes the analog input signal to produce respective first and second digital outputs representing the analog input signal. A switch fabric (not shown) can be configured by the configuration control 352 to select one of the digital outputs for processing. Alternatively, both of the first and second digital outputs can be provided to digital processor 356, and the digital processor 356 can arbitrate between digital outputs. For example, the digital processor 356 can select one of the digital outputs based on a determined characteristic of the outputs. Alternatively, the digital processor 356 can comprise a digital adder or latch for combining the first digital output with the second digital output.

The digital processor 356 can also analyze the digital outputs to determine one or more characteristics of the analog input signal. Data relating to the one or more characteristics can be provided to the configuration control 354 as feedback. The configuration control 304 can utilize the provided feedback and user provided configuration data to adaptively provide an optimal configuration for the ADC according to the determined signal characteristics. For example, the quantization noise and dynamic range of each quantization stage can be tailored depending on a characteristic of the input signal such as amplitude or frequency.

In one implementation, the ADC system is configured as a multiple amplitude range system to adaptively adjust amplitude ranges associated with parallel quantization stages. Quantization levels (e.g., comparator thresholds) associated with the quantization stages 362 and 364 can be set by the configuration control to define an effective quantization range and resolution for each quantization stage. By allocating a number of quantization bits at a given quantization stage (e.g., 362) and setting quantization levels for each bit, the configuration control 352 can establish an effective range of amplitudes over which the quantization stage can quantize an input signal. The bits of quantization and the number of bits allocated between each level can be adaptively adjusted by the configuration control according to feedback provided by the digital processor 356.

In one implementation, the available quantization bits associated with the quantizer assembly 352 can be divided evenly such that the first quantization stage 362 and the second quantization stage 364 each comprise N bits of effective resolution. Quantization levels associated with the first quantization stage can be configured by the configuration control such that they are spread evenly across a range of expected analog signal amplitudes. Accordingly, the first quantization stage 362 is operative to quantize signals over the entire expected range of signal amplitudes. The N-bits of resolution associated with the first quantization stage 362 are spread across a large range of amplitude, however, introducing a large degree of quantization noise into its associated digital output.

The second quantization stage 364 can be configured to distribute its associated quantization levels across a much smaller amplitude range. For example, in many instances, a communications signal can exhibit a large peak-to-average ratio, such that the signal remains around a given amplitude level for the vast majority of its operation, experiencing high amplitude peaks only rarely. The N-bits of resolution (e.g., quantization levels) associated with the second quantization stage 364 can be distributed across a range that encompasses the ordinary (e.g., non-peak) amplitude levels of the signal. Since the quantization levels of the second quantization stage 364 are distributed across a much smaller range of amplitude, the quantization error in the digital output of the second stage is significantly less for signals falling within its associated amplitude range.

From the values of the digital outputs, the digital processor 356 can determine an approximate amplitude for the analog signal and select the output of the stage expected to produce the most accurate output. Additional characteristics, such as a peak-to-average ratio associated with a recent period of operation, can also be determined by the digital processor 356. The configuration control 352 can redistribute the quantization bits associated with the first and second quantization stages 362 and 364 or adjust the quantization levels associated with the stages in response to these determined values.

In another implementation, the ADC system is configured as a multiple frequency range ADC system to provide a wideband signal with one or more comparatively narrow band quantization stages. The first and second quantization stages 362 and 364 can be configured to have different associated frequency passbands. The frequency passband can derive from properties of the quantization stages 362 and 364 themselves or from properties of associated components such as sample and hold components (not shown) or noise shapers (not shown). The passbands of the quantization stages 362 and 364 can be contiguous in frequency or separated by a portion of the frequency spectrum, depending on a desired application. The first and second quantization stages 362 and 364 can quantize an analog input signal in parallel, and the resulting digital outputs can be reconstructed to provide a wideband digital output representing the analog input signal.

For example, in a given signal, a majority of the analog signal power can be found in a low frequency portion of the signal. The first quantization stage 362 can be configured to have an associated passband encompassing the low frequency portion of the signal. The quantization levels of the first quantization stage 362 can be distributed across a wide range of amplitudes associated with the low frequency content of the analog signal to allow the first quantization stage to coarsely quantize the high amplitude signals associated with the low frequency regions of the signal. The second quantization stage 364 can be configured with a higher frequency passband across a more narrow amplitude range associated with the higher frequency content of the analog signal. The quantization levels of the second quantization stage 364 can be distributed across the narrower range of amplitudes associated with the low frequency signal content to allow the second quantization stage to finely quantize the low amplitude signals associated with the high frequency regions of the signal. The resulting outputs can be reconstructed by the digital processor 356 to provide a wideband digital output representing the analog input signal.

The digital processor 356 can monitor a frequency content associated with the analog signal and provide the data as feedback to the configuration control 352. The configuration control can adjust one or more internal parameters associated with the quantization stages 362 and 364 and/or one or more components of the ADC associated with the quantization stages in response to the feedback from the digital processor. For example, the configuration control 352 can alter the frequency ranges associated with the quantization stages to adjust to changes within the frequency content of the signal. Similarly, the configuration control 352 can redistribute the quantization bits associated with the first and second quantization stages 362 and 364 or adjust the quantization levels associated with the stages in response to the determined frequency content.

Figure 8:
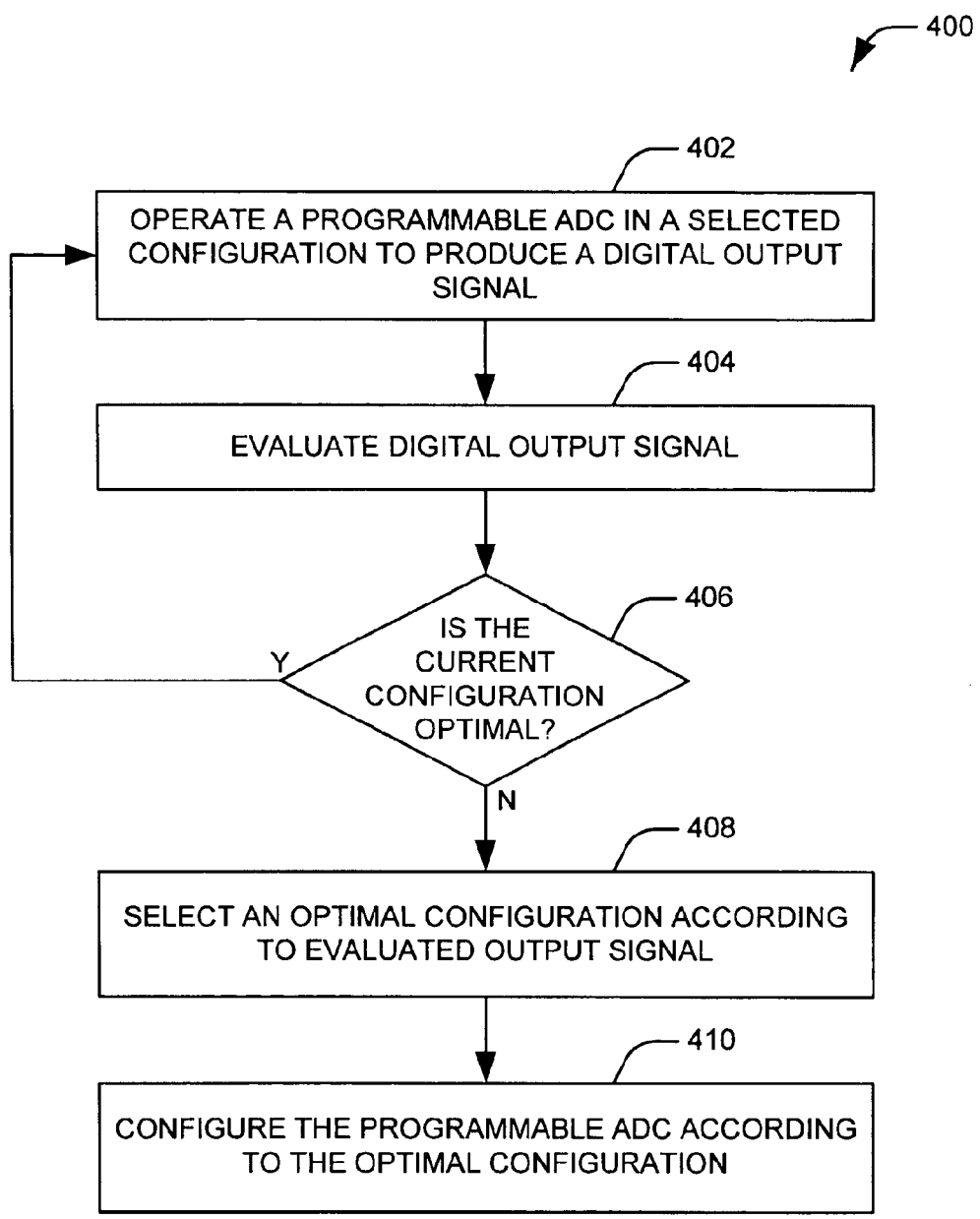
FIG. 8 illustrates a methodology for adaptively selecting an optimal configuration for a programmable ADC in accordance with an aspect of the present invention.

In view of the foregoing structural and functional features described above, certain methods will be better appreciated with reference to FIG. 8. It is to be understood and appreciated that the illustrated actions, in other embodiments, may occur in different orders and/or concurrently with other actions. Moreover, not all illustrated features may be required to implement a method. It is to be further understood that the following methodology can be implemented in hardware (e.g., as one or more integrated circuits or circuit boards containing a plurality of microprocessors), software (e.g., as executable instructions running on one or more processors), or any combination thereof.

FIG. 8 illustrates a methodology 400 for adaptively selecting an optimal configuration for a programmable ADC in accordance with an aspect of the present invention. At 402, the programmable ADC is operated in a selected configuration to convert an analog input signal into a digital output signal. The digital output signal is evaluated at 404 to determine one or more characteristics of the analog input signal. For example, a peak-to-average ratio associated with the can be determined, as the frequency of peaks within the input signal bears upon a necessary dynamic range of the ADC. Various performance characteristics of the ADC can also be determined, such as the effective dynamic range of the conversion and the degree of linearity exhibited by the ADC.

At 406, it is determined if the system is presently in an optimal configuration according to the determined signal characteristics. The determination of an optimal configuration can be based on configuration data associated with each of a plurality of configurations available to the ADC. The ADC can include an expert system that applies a rule based selection process or an optimization algorithm to determine an optimal configuration. Similarly, optimal configuration values for one or more ADC components can be determined from the determined signal characteristics. For example, if the analog signal has begun to drift away from a desired center frequency, configuration values associated with one or more of the ADC components can be altered to account for the change in frequency.

If the signal is already in the determined optimal configuration, the methodology 400 returns to 402, and the system continues to operating in the originally selected configuration. If the signal is not already operating in the optimal configuration, the determined optimal configuration is selected at 408. At 410, the ADC is configured according to the optimal configuration. Configuring the ADC can include adjusting a switch fabric associated with the system to selectively couple a plurality of ADC components into an information stream. For example, if the ADC is transitioning to a configuration that utilizes delta-sigma modulation, a programmable filter assembly can be coupled into the information stream to provide noise shaping of the quantization noise associated with the analog-to-digital conversion.

The configuration can also include internally configuring one or more of the ADC components. For example, a quantizer assembly can be configured to provide one or more quantization stages for quantizing the analog input signal. Depending on the desired configuration, the quantizer assembly can provide a single quantization stage, multiple parallel quantization stage, multiple serial quantization stages, and multiple quantization stages arranged as a combination of serial and parallel stages. For example, the quantizer assembly can provide a plurality of multi-range (e.g. parallel stages, where the quantization noise and dynamic range of each stage is tailored depending on a characteristic of the input signal such as amplitude or frequency. Internal values associated with the ADC components can also be adjusted. These internal values can include filter coefficients in the programmable filter assembly, threshold voltages associated with the quantization stages, or variable resistances associated with one or more digital-to-analog converters. Once the optimal configuration has been implemented, the methodology 400 returns to 402 to continue operating according to the newly selected configuration.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A programmable analog-to-digital converter (ADC) system comprising:
   a quantizer assembly, configurable to provide at least one quantization stage, a given quantization stage converting an associated analog signal into an associated digital output signal; and
   a configuration control that selects among a plurality of configurations and configures the ADC system according to the selected configuration, the quantizer assembly being configurable to provide a plurality of quantization stages arranged in series in a first configuration, and the quantizer assembly being configurable to provide a single quantization stage in a second configuration.

2. The system of claim 1, further comprising a switch fabric operative to selectively couple a plurality of components associated with the programmable ADC system in response to control input from the configuration control.

3. The system of claim 1, further comprising at least one configurable digital-to-analog converter (DAC).

4. The system of claim 3, the at least one configurable DAC comprising a delta-sigma modulator.

5. The system of claim 1, further comprising a digital processor that processes the at least one associated digital output signal from the at least one quantization stage to determine at least one characteristic of the at least one associated analog signal.

6. The system of claim 5, the configuration control adaptively selecting among the plurality of configurations according to feedback from the digital processor.

7. The system of claim 1, the configuration control selecting among the plurality of configurations according to user input.

8. The system of claim 1, further comprising a programmable filter assembly, configurable to provide at least one noise shaping filter, a given noise shaping filter processing the analog signal associated with a respective quantization stage to shape quantization noise associated with the respective quantization stage.

9. The system of claim 8, the given noise shaping filter being operative to provide at least one low noise frequency band associated with the respective quantization stage.

10. The system of claim 9, the given noise shaping filter comprising at least one variable element being programmable by the configuration control to alter at least one respective shape of the at least one low noise frequency band.

11. The system of claim 9, the given noise filter having an associated sample and hold component, the sample and hold component being driven by a clock circuit to control a sample rate at which the associated analog signal is provided to the respective quantization stage, the sample rate being associated with at least one respective center frequency of the at least one low noise frequency band.

12. The system of claim 11, the clock circuit being controlled by the configuration control to alter the at least one respective center frequency of the at least one low noise frequency band.

13. The system of claim 11, the clock circuit comprising a digital frequency synthesizer.

14. A programmable analog-to-digital converter (ADC) system, comprising means for selecting a configuration from a plurality of configurations associated with the programmable ADC;
   means for quantizing an analog input signal; and
   means for configuring the ADC system according to the selected configuration, the means for configuring including means for configuring the means for quantizing to provide two associated quantization stages arranged in series and means for configuring the means for quantizing to provide one associated quantization stage.

15. The system of claim 14, the means for configuring comprising means for configuring the ADC system as a flash ADC.

16. The system of claim 14, the means for configuring comprising means for configuring the ADC system as a half-flash ADC.

17. The system of claim 14, the means for configuring comprising means for configuring the ADC system as a single-bit delta-sigma ADC.

18. The system of claim 14, the means for configuring comprising means for configuring the ADC system as a multi-bit delta-sigma ADC.

19. The system of claim 14, the means for configuring comprising means for configuring the ADC system as a cascaded delta-sigma ADC.

20. The system of claim 14, the means for configuring comprising means for configuring the ADC system as a hybrid ADC system comprising a flash ADC and a delta-sigma ADC.

21. The system of claim 14, the means for configuring comprising means for configuring the ADC system as a multi-range ADC system comprising a plurality of quantization stages in parallel.

22. The system of claim 21, the means for configuring comprising means for configuring the ADC system as a multiple amplitude range ADC system, such that the plurality of quantization stages have associated amplitude ranges, the means for configuring further comprising means for adaptively adjusting the associated amplitude ranges of the plurality of quantization stages according to a determined amplitude of the analog input signal.

23. The system of claim 21, the means for configuring comprising means for configuring the ADC system as a multiple frequency range ADC system, such that the plurality of quantization stages have associated frequency ranges, the means for configuring further comprising means for adaptively adjusting one of the associated frequency ranges and respective associated amplitude ranges of the plurality of quantization stages according to a determined frequency content of the analog input signal.

24. A method of configuring a programmable analog-to-digital converter (ADC) comprising:
   selecting between at least a first configuration and a second configuration, the first configuration being characterized in that a quantizer assembly associated with the programmable ADC is configured into a single quantization stage and the second configuration being characterized in that the quantizer assembly is configured into a plurality of quantization stages, with at least two of the plurality of quantization stages being configured in series; and
   configuring the quantizer assembly according to the selected configuration.

25. The method of claim 24, further comprising configuring a programmable filter assembly according to the selected configuration to provide at least one noise shaper, a given noise shaper being operative to provide delta-sigma modulation of an analog input signal in combination an associated one of the plurality of quantization stages.

26. The method of claim 24, further comprising converting an analog signal into a digital signal using the selected ADC configuration.

27. The method of claim 26, further comprising analyzing the digital signal to determine at least one property of the analog signal.

28. The method of claim 27, further comprising selecting between the first configuration and the second configuration according to the determined at least one property of the analog signal.

* * * * *